United States Patent
Huang et al.

(10) Patent No.: US 11,650,245 B2
(45) Date of Patent: May 16, 2023

(54) TEST SYSTEM AND SIGNAL TRANSMISSION CIRCUIT BOARD THEREOF

(71) Applicant: Yungu (Gu'an) Technology Co., Ltd., Hebei (CN)

(72) Inventors: Genmao Huang, Langfang (CN); Gusheng Xu, Langfang (CN); Li Lin, Langfang (CN); Bo Yuan, Langfang (CN); Siming Hu, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 85 days.

(21) Appl. No.: 17/211,017

(22) Filed: Mar. 24, 2021

(65) Prior Publication Data
US 2021/0208191 A1    Jul. 8, 2021

Related U.S. Application Data

(63) Continuation of application No. PCT/CN2019/108560, filed on Sep. 27, 2019.

(30) Foreign Application Priority Data

Mar. 1, 2019    (CN) .......................... 201910155780.X

(51) Int. Cl.
*G01R 31/28*    (2006.01)

(52) U.S. Cl.
CPC ................... *G01R 31/2825* (2013.01)

(58) Field of Classification Search
CPC .... G01R 31/2825; G01R 1/0416; G01R 1/02; G01R 31/00

USPC ......................................................... 324/511
See application file for complete search history.

(56) References Cited

FOREIGN PATENT DOCUMENTS

| CN | 101826505 | A |   | 9/2010 |           |
|----|-----------|---|---|--------|-----------|
| CN | 203838446 | U |   | 9/2014 |           |
| CN | 104360509 |   | * | 2/2015 | G02F 1/1309 |
| CN | 104360509 | A |   | 2/2015 |           |
| CN | 204348296 | U |   | 5/2015 |           |
| CN | 106057112 | A |   | 10/2016 |          |
| CN | 206115354 | U |   | 4/2017 |           |
| CN | 107134242 | A |   | 9/2017 |           |
| CN | 206953401 |   | * | 2/2018 | G02F 1/1309 |
| CN | 206953401 | U |   | 2/2018 |           |
| CN | 207180762 | U |   | 4/2018 |           |
| CN | 207489366 | U |   | 6/2018 |           |
| CN | 207799028 | U |   | 8/2018 |           |
| CN | 108519536 | A |   | 9/2018 |           |
| CN | 108666356 | A |   | 10/2018 |          |
| CN | 108803164 | A |   | 11/2018 |          |

(Continued)

OTHER PUBLICATIONS

Chinese First Office Action dated Nov. 25, 2019 in corresponding Chinese application No. 201910155780.X; 20 pages.

(Continued)

*Primary Examiner* — Tung X Nguyen
*Assistant Examiner* — Robert P Alejnikov, Jr.
(74) *Attorney, Agent, or Firm* — Maier & Maier, PLLC

(57) ABSTRACT

A signal transmission circuit board includes a main body and a first connecting unit connected with the main body. The first connecting unit includes a test pin area and an avoidance area adjacent to the test pin area, and the avoidance area is free of test pins.

18 Claims, 7 Drawing Sheets

(56) References Cited

FOREIGN PATENT DOCUMENTS

| | | | |
|---|---|---|---|
| CN | 109064957 | A | 12/2018 |
| CN | 110018368 | A | 7/2019 |
| JP | H06102311 | A | 4/1994 |
| KR | 101350155 | B1 | 1/2014 |

OTHER PUBLICATIONS

Chinese Second Office Action dated Apr. 13, 2020 in corresponding Chinese application No. 201910155780.X; 11 pages.
Notification to Grant Patent Right for Invention dated Aug. 17, 2020 in corresponding Chinese application No. 201910155780.X; 6 pages.

* cited by examiner

TEST SYSTEM AND SIGNAL TRANSMISSION CIRCUIT BOARD THEREOF

CROSS-REFERENCE TO RELATED APPLICATIONS

The present application is a continuation-application of International (PCT) Patent Application No. PCT/CN2019/108560 filed on Sep. 27, 2019 in the State Intellectual Property Office of China, which claims foreign priority of Chinese Patent Application No. 201910155780.X, filed on Mar. 1, 2019 in the State Intellectual Property Office of China, the contents of all of which are hereby incorporated by reference.

TECHNICAL FIELD

The present disclosure relates to the field of display screen test technology, and particularly, to a test system and a signal transmission circuit board thereof.

BACKGROUND

With development of science and technology, the display screen has been the necessity in people's life and is the focus of the research and development.

Cell test is a step of dot screen test and aging test on a screen of a single display screen before bonding. Thus, a poor screen can be screened out before putting into the module procedure.

In order to realize the function integration, the present circuit board comprises a variety of functional pin areas. However, in the progress of cell test on the screen, complex function pin areas can cause damage to a driving chip connecting unit of the screen by the signal transmission circuit board.

SUMMARY

The technical problem mainly solved by the present disclosure is to provide a test system and a signal transmission circuit board. Thus, the damage to the driving chip connecting unit of the screen by the signal transmission circuit board in the progress of cell test can be decreased and a qualification rate of product can be improved.

In order to solve the above technical problem, a technical solution adopted by the present disclosure is to provide a signal transmission circuit board. The signal transmission circuit board includes: a main body and a first connecting unit connected with the main body. The first connecting unit includes a test pin area and an avoidance area adjacent to the test pin area, and there are no test pins in the avoidance area.

In order to solve the above technical problem, another technical solution adopted by the present disclosure is to provide a test system. The test system includes: a test device and a signal transmission circuit board for connecting the test device and a display screen. The signal transmission circuit board is the above signal transmission circuit board.

In the embodiments of the present disclosure, the signal transmission circuit board comprises a main body and a first connecting unit connected with the main body, and the first connecting unit comprises a test pin area and an avoidance area adjacent to the test pin area. There are no test pins in the avoidance area to avoid the first connecting unit from crushing the driving chip connecting unit in the test process, and then a good electrical contact can be formed between the driving chip and the driving chip connecting unit in the progress of the subsequent bonding. Thus, the problem of poor display of the display screen (for example, the problem of a bright line on the display screen) can be avoided. Furthermore, because only the structure of the signal transmission circuit board is improved, the design of the display screen does not need to be changed, and the cost can be saved under the condition that the poor display of the display screen can be effectively solved.

BRIEF DESCRIPTION OF THE DRAWINGS

In order to make the technical solution described in the embodiments of the present disclosure more clearly, the drawings used for the description of the embodiments will be briefly described. Apparently, the drawings described below are only for illustration, but not for limitation. It should be understood that, one skilled in the art may acquire other drawings based on these drawings, without making any inventive work.

DETAILED DESCRIPTION OF THE PREFERRED EMBODIMENTS

Figure 1:
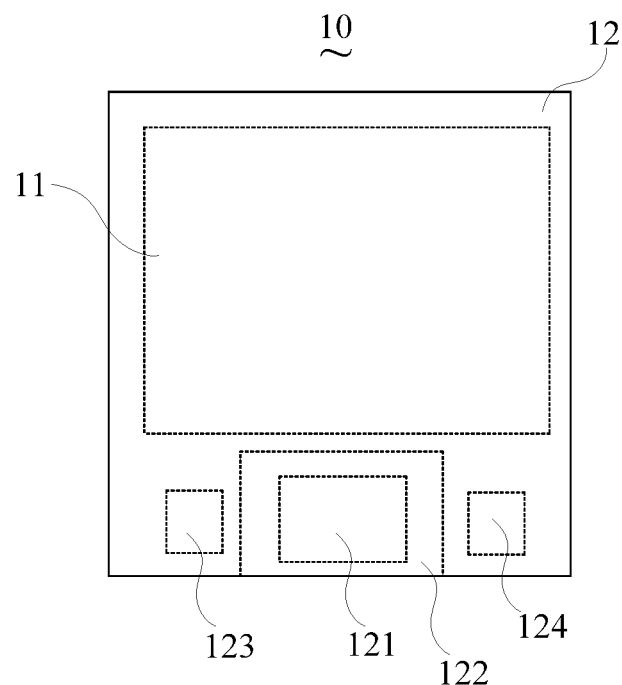
FIG. 1 is a structural schematic diagram of a display screen according to the first embodiment of the present disclosure.

In order to facilitate the understanding of the present disclosure, the present disclosure will be described more fully hereinafter with reference to the accompanying drawings. Preferred embodiments of the present disclosure are given in the drawings. However, the present disclosure may be embodied in many different forms and is not limited to the embodiments described herein. Rather, these embodiments are provided so that the present disclosure will be more fully understood.

Referring to FIG. 1, FIG. 1 is a structural schematic diagram of a display screen according to the first embodiment of the present disclosure. In the embodiment, the display screen 10 can comprise a display unit 11 and a non-display unit 12 on periphery of the display unit 11.

The display unit 11 can comprise a display pixel array.

Alternatively, the non-display unit 12 may comprise a driving chip connecting unit 121, a peripheral wire leading out unit 122, a first test pin unit 123, and a second test pin unit 124.

Alternatively, the driving chip connecting unit 121 may be located between the first test pin unit 123 and the second test pin unit 124. The driving chip connecting unit 121 may be located on an edge of the display screen 10, and the first test pin unit 123 and the second test pin unit 124 may be located on both sides of the driving chip connecting unit 121 respectively. For example, the first test pin unit 123, the driving chip connecting unit 121 and the second test pin unit 124 may be arranged along the edge of the display screen 10 from left to right in turn and are substantially in a straight line.

In the above solution, because the first test pin unit 123, the driving chip connecting unit 121 and the second test pin unit 124 are substantially in a straight line, width of the non-display screen 12 can be decreased, which is conducive to design of a narrow frame. Thus, proportion of the display screen can be increased. The design causes in response to the display screen being connected with a signal transmission circuit board, the first connecting unit of the signal transmission circuit board is connected with the first test pin unit 123 and the second test pin unit 124, and will partly cover the driving chip connecting unit 121. In response to there being pins in the signal transmission circuit board corresponding to the driving chip connecting unit 121, the pins cannot avoid an area of the driving chip connecting unit 121. Thus, a risk of screen damage is greatly increased in response to the signal transmission circuit board being connected with a screen. The signal transmission circuit board described in the following can ensure that in response to the signal transmission circuit board being connected with the display screen, a risk of damage to the driving chip connecting unit 121 can be reduced.

The driving chip connecting unit 121 is provided with wires or pins. The wires or the pins are configured to be electrically connected with a driving chip during bonding.

The peripheral wire leading out unit 122 may be located on periphery of the driving chip connecting unit 121. Furthermore, the peripheral wire leading out unit 122 is provided with wiring configured to electrically connect the wires or the pins at the driving chip connecting unit 121 with other units, for example, to electrically connect a display pixel array of the display unit 11.

The first test pin unit 123 is provided with a plurality of test pins (not labeled in figures) and the second test pin unit 124 is provided with a plurality of test pins (not labeled in figures).

The above display screen 10 is the display screen in a cell test stage. In the cell test stage, the display screen 10 has not been bonding. Bonding refers to attaching a driving chip and/or a flexible circuit board for input display signals to the driving chip connecting unit 121, comprising but not limited to directly attaching the driving chip to the driving chip connecting unit on a display glass (i.e. Chip On Glass, COG), attaching the driving chip to the flexible circuit board and then attaching to the driving chip connecting unit on the screen (i.e. Chip On Film, COF), or attaching the driving chip to the driving chip connecting unit on a flexible substrate of the display screen (i.e. Chip On PI, COP) and so on. In other words, in the cell test stage, the driving chip connecting unit 121 is exposed.

Alternatively, the display screen 10 can be a flexible display screen or a hard display screen. It is not limited.

Figure 2:
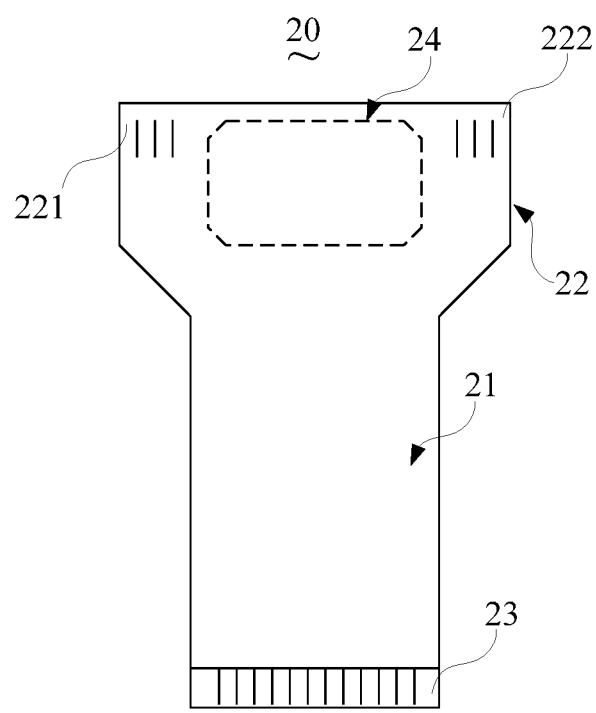
FIG. 2 is a structural schematic diagram of a signal transmission circuit board according to the first embodiment of the present disclosure.

Referring to FIG. 2. FIG. 2 is a structural schematic diagram of a signal transmission circuit board according to the first embodiment of the present disclosure.

In the embodiment, the signal transmission circuit board 20 may comprise a main body 21 and a first connecting unit 22.

The main body 21 comprises a second connecting unit 23.

The first connecting unit 22 is connected with the main body 21. The first connecting unit 22 and the main body 21 are respectively located on opposite sides of each other. For example, the first connecting unit 22 may be located on an upper side of the main body 21, and the main body 21 may be located on a lower side of the first connecting unit 22. The first connecting unit 22 and the main body 21 may be arranged as an integral structure.

Alternatively, the second connecting unit 23 may be located at an end of the main body unit 21 away from the first connecting unit 22.

The first connecting unit 22 comprises a test pin area and an avoidance area 24. The avoidance area 24 is adjacent to the test pin area, and there are no test pins in the avoidance area 24.

The avoidance area 24 is configured that in response to the first connecting unit 22 being electrically connected with the test pins of the display screen, the first connecting unit 22 at least does not contact with the driving chip connecting unit of the display screen, or a force or pressure on the driving chip connecting unit is less than a threshold value in response to the first connecting unit 22 contacting with the driving chip connecting unit.

It should be noted that the threshold value is a value obtained from test. Taking testing force threshold as an example, different force are applied to the driving chip connecting unit 121, and conduction performance of the driving chip and the driving chip connecting unit 121 or display performance of display screen corresponding to different pressures after bonding with the driving chip and the driving chip connecting unit 121. The threshold value is a maximum force value which is able to make the conduction performance or display performance up to standard.

In an application scenario, in response to the first connecting unit 22 being electrically connected with the test pins, a position of the avoidance area 24 on the first connecting unit 22 corresponds to a position of the driving chip connecting unit 121. The avoidance area 24 may be arranged on an overlapping area between the first connecting unit 22 and the driving chip connecting unit 121, and the avoiding area 24 may be arranged on the first connecting unit 22.

The first connecting unit 22 is at least partially excavated in a thickness direction of the overlapping area, for example, the avoidance area 24 is completely hollowed out to form a void area, or the avoidance area 24 is partially excavated so that a thickness of the avoidance area 24 is smaller than a thickness of the test pin area to form a groove. Thus, in response to the first connecting unit 22 being electrically connected with the test pins, the driving chip connecting unit 121 can be at least partially received in the groove or exposed through the void area. For details, please refer to the description of the embodiment below.

Alternatively, area and hollowing degree of the avoidance area 24 can specifically satisfy that in response to the first connecting unit 22 being electrically connected with the test pins of the display screen 10, the first connecting unit 22 does not contact with the driving chip connecting unit 121 and the peripheral wire leading out unit 122 of the display screen 10, or the force or the pressure on the driving chip connecting unit 121 and the peripheral wire leading out unit 122 is less than the threshold value in response to the first connecting unit 22 contacting with the driving chip connecting unit.

Through the above solution, not only crush of signal transmission circuit board on the driving chip connecting unit can be avoided, but also crush on the peripheral wire leading out unit can be avoided. Thus, the problems, for example, peripheral wire breakage can be avoided, so that the driving chip after bonding can be smoothly connected with other parts of the display screen.

Alternatively, in the present embodiment, the avoidance area 24 is a void area. That is, the first connecting unit 22 is completely hollowed out at a position where the avoidance area 24 may be located.

Alternatively, the test pin area of the first connecting unit 22 is used to be electrically connected with the test pins of the display screen 10. In response to the first connecting unit 22 being electrically connected with the test pins, the position of the avoidance area 24 on the first connecting unit 22 corresponds to the position of the driving chip connecting unit 121. The avoidance area 24 may be located on the overlapping area between the first connecting unit 22 and the driving chip connecting unit 121, and the avoiding area 24 may be arranged on the first connecting unit 22. In response to the first connecting unit 22 being electrically connected with the test pins, the first connecting unit 22 does not contact with the driving chip connecting unit 121 of the display screen 10.

In the above solution, the first connecting unit 22 is provided with an avoidance area 24. In response to the first connecting unit 22 being connected with the display screen 10, the first connecting unit 22 does not contact with the driving chip connecting unit 121 of the display screen 10 because the avoidance area 24 is completely hollowed out in a thickness direction to form a void area. The first connecting unit 22 will not crush the driving chip connecting unit 121, so that the driving chip can make good electrical contact with the driving chip connecting unit 121 at subsequent bonding time. Thus, a problem of poor display of the display screen 10 (for example, a problem of displaying a bright line) due to damage of the driving chip connecting unit 121 can be avoided, and a product qualification rate can be improved. Besides, the above design only changes a structure of the first connecting unit 22, and does not change the design of the display screen. Thus, design cost can be saved.

Alternatively, the test pin area comprises a first test pin area 221 and a second test pin area 222. The avoidance area 24 may be arranged between the first test pin area 221 and the second test pin area 222. The first test pin area 221 may be located on one side of the avoidance area 24 and the second test pin area 222 may be located on another side opposite to the one side of the avoidance area 24. Furthermore, the first test pin area 221, the second test pin area 222 and the avoidance area 24 are all located on an edge area away from the main body 21. For example, the first test pin area 221, the avoidance area 24 and the second test pin area 222 are substantially distributed along a straight line from left to right, thus corresponding to pin positions on the display screen 10.

The first test pin area 221 is provided with a plurality of pins, and the number of pins corresponds to the number of test pins on the first test pin unit 123. That is, the number of the plurality of pins is equal to the number of the test pins on the first test pin unit 123.

The second test pin area 222 is also provided with a plurality of pins, and the number of pins corresponds to the number of test pins on the second test pin unit 124. That is, the number of pins is equal to the number of test pins on the second test pin unit 124.

In response to the first connecting unit 22 being connected with the test pins, pins on the first test pin area 221 are connected with the test pins on the first test pin unit 123 one by one, and pins on the second test pin area 222 are connected with the test pins on the second test pin unit 124 one by one.

In the above solution, two test pin areas are provided to connect with the test pins at different positions on the display screen, which can improve stability of connection between the signal transmission circuit board and the display screen, and avoid separation of the signal transmission circuit board and the display screen due to pulling of the signal transmission circuit board during the cell test and affecting the test efficiency.

It should be understood that in other embodiments, in response to layout space of the non-display area is sufficient, the first connecting unit can comprise three test pin areas, and positions of the three test pin areas are not collinear, but forming a triangular position relationship. Thus, stability of the connection between the signal transmission circuit board and the display screen can be further ensured.

Figure 3:
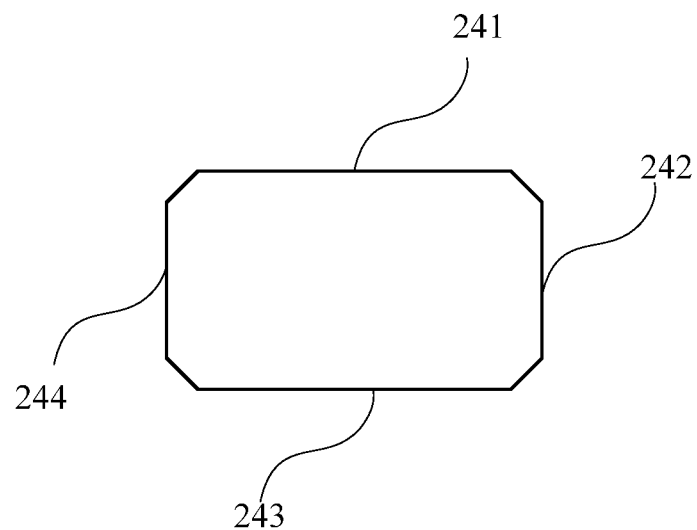
FIG. 3 is a shape schematic diagram of outer contour of an avoidance area according to one embodiment of the present disclosure.

Please referring to FIG. 3, FIG. 3 is a shape schematic diagram of outer contour of an avoidance area according to one embodiment of the present disclosure.

Alternatively, the outer contour of the avoidance area 24 comprises at least two adjacent line segments connected to each other, and the two adjacent line segments are transitionally connected by a curved line or a straight line.

The outer contour of the avoidance area 24 refers to a shape of the avoidance area 24 on the first connecting unit 22.

Alternatively, the outer contour of the avoidance area 24 can comprise four line segments, namely, a first line segment 241, a second line segment 242, a third line segment 243, and a fourth line segment 244.

Alternatively, the first line segment 241 and the third line segment 243 are opposite and parallel to each other, and the second line segment 242 and the fourth line segment 244 are opposite and parallel to each other.

The first line segment 241 and the second line segment 242 are transitionally connected by a straight line, and the straight line is not parallel to the first line segment 241 and the second line segment 242.

The second line segment 242 and the third line segment 243 are transitionally connected by a straight line, and the straight line is not parallel to the second line segment 242 and the third line segment 243.

The third line segment 243 and the fourth line segment 244 are transitionally connected by a straight line, and the straight line is not parallel to the third line segment 243 and the fourth line segment 244.

The fourth line segment 244 and the first line segment 241 are transitionally connected by a straight line, and the straight line is not parallel to the fourth line segment 244 and the first line segment 241.

In other words, the outer contour of avoidance area 24 can be formed by rectilinear chamfering at four corners of a rectangle. The outer contour shape of the avoidance area 24 is not limited to rectangle, but can also be triangle, trapezoid and so on. The outer contour shape of the avoidance area 24 is not limited in the embodiment.

Figure 4:
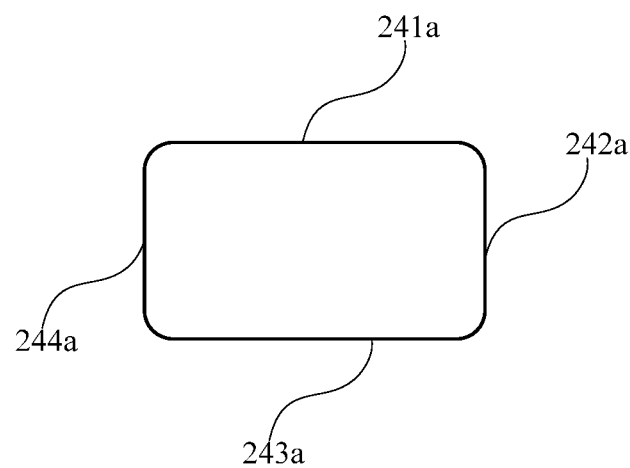
FIG. 4 is a shape schematic diagram of outer contour of an avoidance area formed by fillet four corners of a rectangle according to another embodiment of the present disclosure.

Referring to FIG. 4. FIG. 4 is a shape schematic diagram of outer contour of an avoidance area according to another embodiment of the present disclosure.

The outer contour of the avoidance area 24 can comprise four line segments, namely the first line segment 241a, the second line segment 242a, the third line segment 243a, and the fourth line segment 244a.

Alternatively, the first line segment 241a and the third line segment 243a are opposite and parallel to each other, and the second line segment 242a and the fourth line segment 244a are opposite and parallel to each other.

The first line segment 241a and the second line segment 242a are transitionally connected by a curved line.

The second line segment 242a and the third line segment 243a are transitionally connected by a curved line.

The third line segment 243a and the fourth line segment 244a are transitionally connected by a curved line.

The fourth line segment 244a and the first line segment 241a are transitionally connected by a curved line.

In other words, the outer contour of the avoidance area can be formed by fillet four corners of a rectangle.

The outer contour of the avoidance area can also be other shapes, such as arbitrary polygon, which is transited by a straight line or a curved line at the junction of two adjacent line segments.

In the above solution, because the adjacent line segments are connected through a straight line, an angle formed is larger than that of adjacent line segments directly connected. Thus sharp edges and corners can be avoid to reduce the damage to the display screen caused by the first connecting unit when connecting with the test pins, especially the damage to the driving chip connecting unit and the peripheral wire leading out unit.

In the above two embodiments, the outer contour shape of the avoidance area is closed. It should be understood that the outer contour shape of the avoidance area can be unclosed, such as a gap and so on.

For the case where the avoidance area is a void area, the signal transmission circuit boards according to the second embodiment and the third embodiment of the present disclosure are described in detail. In one embodiment, the avoidance area is a gap. In another embodiment, the avoidance area is a through hole.

Figure 5:
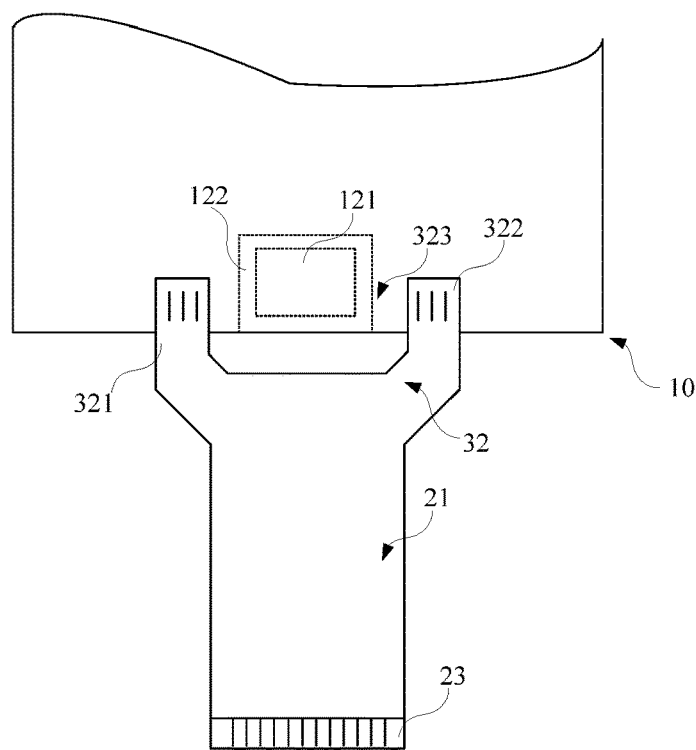
FIG. 5 is a structural schematic diagram of a signal transmission circuit board with avoidance area being a void area according to the second embodiment of the present disclosure.

Please referring to FIG. 5, FIG. 5 is a structural schematic diagram of a signal transmission circuit board according to the second embodiment of the present disclosure.

In the embodiment, the avoidance area 323 is a void area, in other words, the avoidance area 323 is completely hollowed out in a thickness direction of the first connecting unit 32 to form a gap 323 on a side of the first connecting unit 32 away from the main body 21.

Alternatively, in an application scenario, the gap 323 is used to expose the driving chip connecting unit 121 and the peripheral wire leading out unit 122 in response to the first connecting unit 32 is connected to the test pins of the display screen 10.

It should be understood that since the compressive strength of the peripheral wire leading out unit 122 is much greater than that of the driving chip connecting 121. Thus, in other embodiments, the gap 323 may only expose the driving chip connecting unit 121.

The outer contour of the gap 323 comprises at least two adjacent line segments connected to each other. The two adjacent line segments are transited by straight lines or curved lines. For example, right angles or sharp corners of the contour of the gap 323 is fillet or chamfered.

The first connecting unit 32 comprises a first test pin area 321 and a second test pin area 322. The first test pin area 321 is configured to connect with the first test pin unit 123 during testing. The second test pin area 322 is configured to connect with the second test pin unit 124 during testing.

The gap 323 may be located between the first test pin area 321 and the second test pin area 322.

Figure 6:
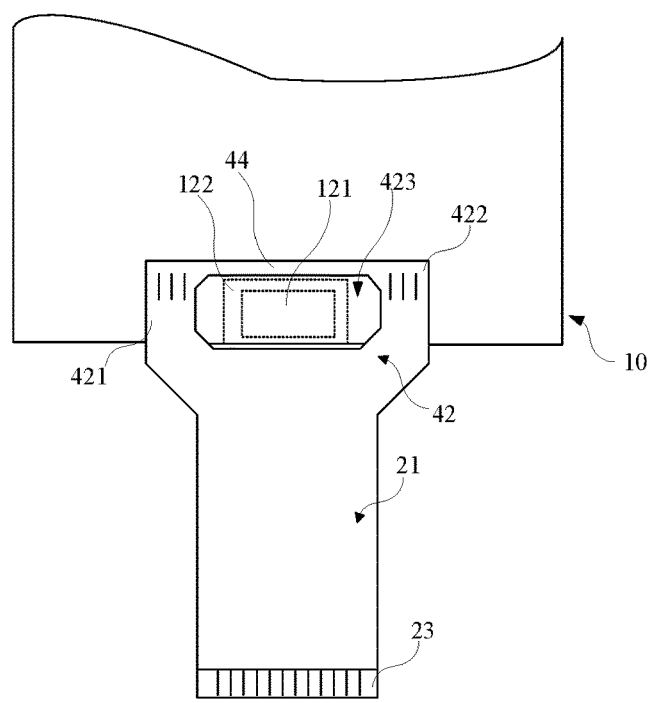
FIG. 6 is a structural schematic diagram of a signal transmission circuit board with avoidance area being a void area and the void area being closed by a connector according to the third embodiment of the present disclosure.

Please referring to FIG. 6, FIG. 6 is a structural schematic diagram of a signal transmission circuit board according to the third embodiment of the present disclosure.

In the embodiment, the avoidance area 423 is a void area, and the first connecting unit 42 comprises a first test pin area 421 and a second test pin area 422. An end of the first test pin area 421 away from the main body 21 and an end of the second test pin area 422 away from the main body 21 are connected by a connector 44, and the void area is closed by the connector 44. In other words, the first connecting unit 42 is completely hollowed out in a thickness direction at location of the avoidance area 423 to form a through hole at a position of the first connecting unit 42 corresponding to the avoidance area.

Alternatively, in an application scenario, the through hole is configured to expose the driving chip connecting unit 121 and the peripheral wire leading out unit 122 in response to the first connecting unit 42 being connected to the test pins of the display screen 10.

The outer contour of the through hole comprises four line segments, and each group of adjacent connected two line segments are transited by a straight line or a curved line. For example, right angles or sharp corners of the outer contour of a through hole are rounded or chamfered.

The first test pin area 421 is configured to be connected with the first test pin unit 123 during testing. The second test pin area 422 is configured to be connected with the second test pin unit 124 during testing.

The through hole may be located between the first test pin area 421 and the second test pin area 422.

It should be understood that the avoidance area may not be a void area, but the thickness of the avoidance area is only less than that of the test pin area. For details, refer to the description of the fourth embodiment of the signal transmission circuit board.

Figure 7:
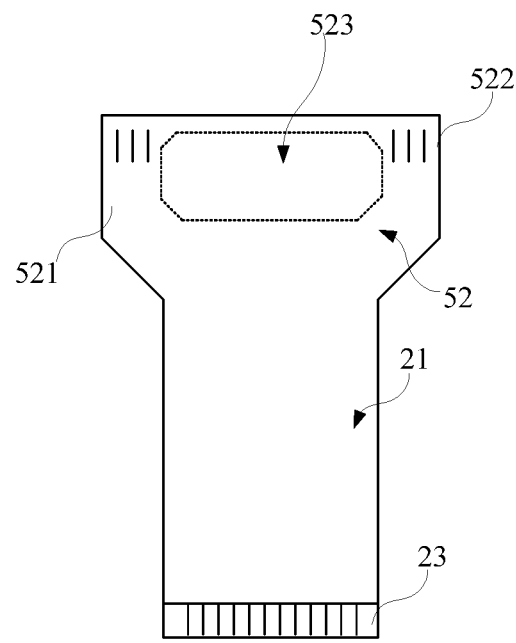
FIG. 7 is a structural schematic diagram of a signal transmission circuit board with avoidance area being a groove according to the fourth embodiment of the present disclosure.
Figure 13:
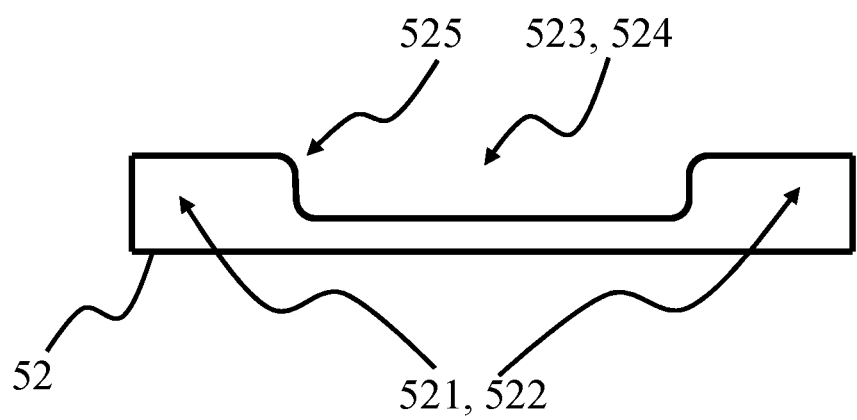
FIG. 13 is a structural schematic diagram showing a cross section of a signal transmission circuit board with avoidance area being a groove according to the fourth embodiment of the present disclosure.

FIGS. 7 and 13 show a structural schematic diagram of a signal transmission circuit board according to the fourth embodiment of the present disclosure.

In the embodiment, the thickness of the avoidance area 523 is less than the thickness of the test pin area 521, 522. The avoidance area 523 is a groove 524.

In other words, the avoidance area 523 is partially excavated in the thickness direction to form a groove 524 on the first connecting unit 52.

In an application scenario, the groove is configured to at least partly receive the driving chip connecting unit 121 and the peripheral wire leading out unit 122 in response to the first connecting unit 52 being connected to the test pin of the display screen 10.

Alternatively, curved surfaces 525 are formed between side walls of the groove 524 and between side walls and the groove bottom. The side walls of the groove and the first wall surface closed to the first connecting unit 52 are connected by curved surfaces 525. A notch edge of the groove is a curved surface 525. Notch of the groove faces the driving chip connecting unit 121.

Through the above solution, a right angle or a sharp corner edge does not exist in the groove, even if contact between the first connecting unit 52 and the driving chip connecting unit 121 or the peripheral wire leading out unit 122 occurs, the contact is also a curved surface contact. Thus, an contact area is increased and crushing the driving chip connecting unit 121 or the peripheral wire leading out unit 122 can be avoided.

The first connecting unit 52 comprises a first test pin area 521 and a second test pin area 522. The first test pin area 521 is configured to connect with the first test pin unit 123 during testing. The second test pin area 522 is configured to connect with the second test pin unit 124 during testing.

The groove may be located between the first test pin area 521 and the second test pin area 522.

In the above solution, the first connecting unit 52 is provided with an avoidance area. In response to the first connecting unit 52 being connected with the display screen 10, the thickness of the avoidance area is less than that of the test pin area because the avoidance area is partially hollowed out in the thickness direction, and a groove 524 is formed at the avoidance area. Depth of the groove 524 and an area of the groove 524 satisfy that a force or pressure of the first connecting unit 52 on the driving chip connecting unit 121 and the peripheral wire leading out unit 122 is less than the threshold value in response to the first connecting unit 52 being in contact with the driving chip connecting unit 121. The first connecting unit 52 will not crush the driving chip connecting unit 121, so that the driving chip can make good electrical contact with the driving chip connecting unit 121 at the subsequent bonding time. Thus, the problem of poor display of the display screen 10 caused by the damage of the driving chip connecting unit 121 (for example, the problem of displaying the bright line) can be avoided and the qualification rate of the product can be improved. Besides, only the structure of the first connecting unit is changed in the above solution, the design of the display screen will not be changed and the design cost can be saved.

Figure 8:
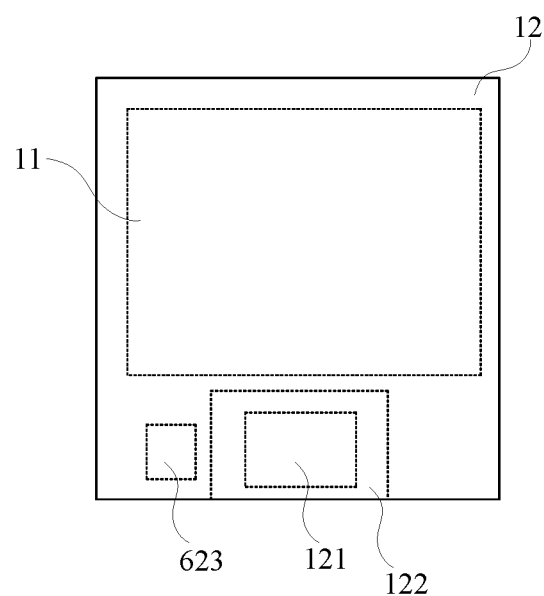
FIG. 8 is a structural schematic diagram of a display screen with the number of test pin units being one according to second embodiment of the present disclosure.

Please referring to FIG. 8, FIG. 8 is a structural schematic diagram of a display screen according to second embodiment of the present disclosure.

Compared with the display screen provided by the first embodiment, the difference is that in the second embodiment, the number of test pin units 623 is one and the test pin unit 623 may be located on one side of the driving chip connecting unit 121.

Figure 9:
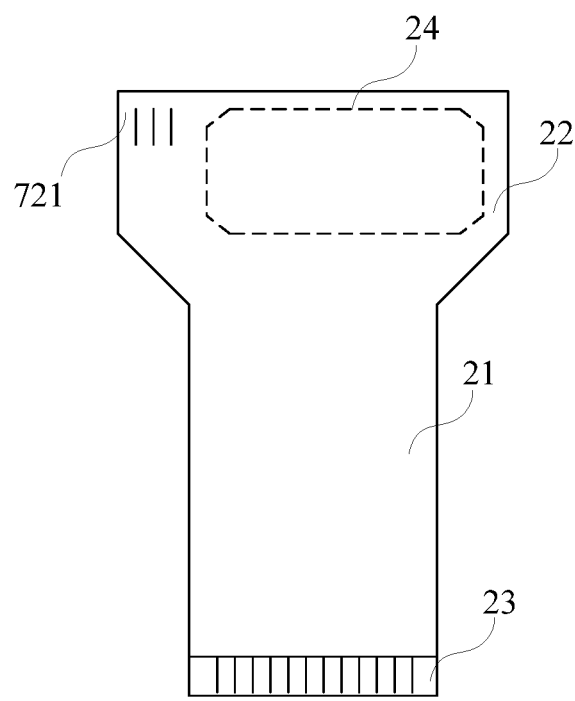
FIG. 9 is a structural schematic diagram of a signal transmission circuit board with the number of test pin areas being one according to the fifth embodiment of the present disclosure.

Please referring to FIG. 9, FIG. 9 is a structural schematic diagram of a signal transmission circuit board according to the fifth embodiment of the present disclosure.

Compared with the signal transmission circuit board provided by the first embodiment, the difference is that in the fifth embodiment, the number of test pin areas 721 is one. The test pin area 721 may be located on one side of the avoidance area 24. The first connecting unit on the other side of the avoidance area 24 is free of pins. The first connecting unit is only used for bonding with the display screen to improve stability of the connection between the signal transmission circuit board and the display screen.

During testing, the test pin area 721 is electrically connected with the test pin unit 623.

Figure 10:
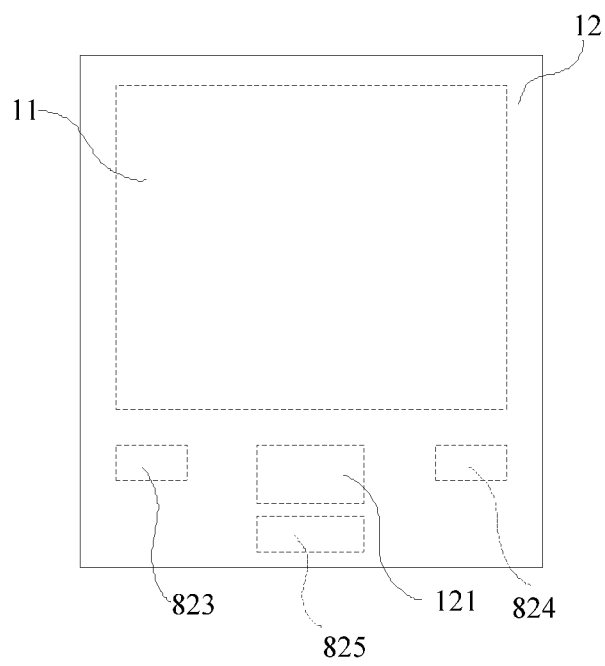
FIG. 10 is a structural schematic diagram of a display screen with the number of test pin units being three according to third embodiment of the present disclosure.

Please referring to FIG. 10, FIG. 10 is a structural schematic diagram of a display screen according to third embodiment of the present disclosure.

Compared with the display screen provided by the first embodiment, the difference is that in the third embodiment, the number of the test pin units is three, namely a test pin unit 823, a test pin unit 824 and a test pin unit 825, which may be located around the driving chip connecting unit 121.

Figure 11:
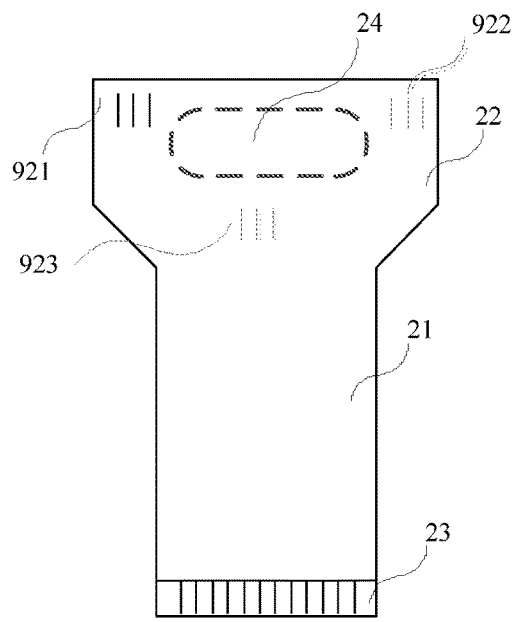
FIG. 11 is a structural schematic diagram of a signal transmission circuit board with the number of test pin areas being three according to the sixth embodiment of the present disclosure.

Please referring to FIG. 11, FIG. 11 is a structural diagram of a signal transmission circuit board according to the sixth embodiment of the present disclosure.

Compared with the signal transmission circuit board provided by the first embodiment, the difference is that in the sixth embodiment, the number of the test pin areas is three, namely a test pin area 921, a test pin area 922 and a test pin area 923, which may be located around the avoidance area 24. Positions of the three test pin areas are not collinear, but forming a triangle position relationship. Thus the stability of the connection between the signal transmission circuit board and the display screen is further ensured.

During the test, the test pin area 721 is electrically connected with the test pin unit 623.

Figure 12:
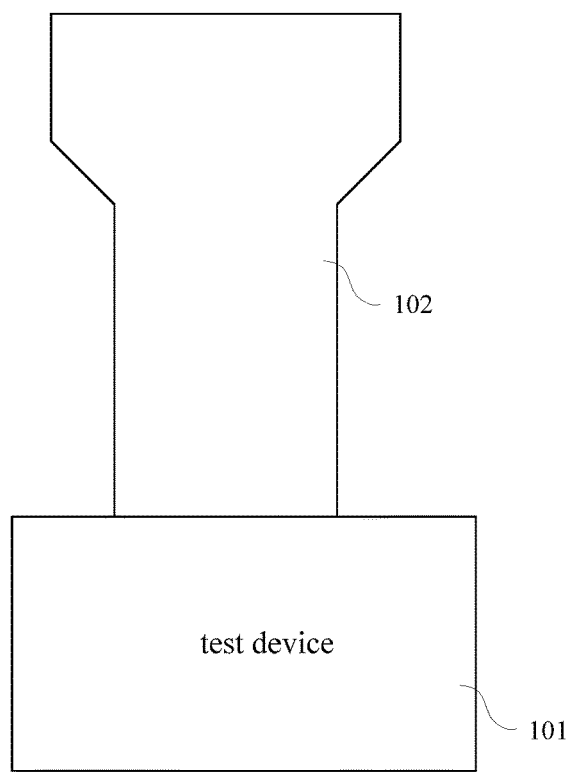
FIG. 12 is a structural schematic diagram of a test system according to one embodiment of the present disclosure.

Please referring to FIG. 12, FIG. 12 is the structural diagram of a test system according to one embodiment of the present disclosure.

In the embodiment, the test system 100 comprises a test device 101 and the signal transmission circuit board 102.

The test device 101 is connected with the second connecting unit 23 of the signal transmission circuit board 102. That is, the test device 101 is connected with the second connecting unit 23 in any one of the above embodiments.

The test device 101 may be a test device for cell test. The test device can also be other test device, which is not limited.

During testing, the first connecting unit of the signal transmission circuit board 102 is connected with the display screen. Please refer to the above description for details. It will not be repeated here.

In any one of the above embodiments, the signal transmission circuit board may be a flexible circuit board (FPC), and the display screen may be a flexible display screen. It should be understood that the signal transmission circuit board can also be a hard circuit board, and the display screen can also be other display screens, for example hard display screens. It is not limit in the embodiment.

In the embodiments of the present disclosure, the signal transmission circuit board comprises a main body and a first connecting unit connected with the main body, and the first connecting unit comprises a test pin area and an avoidance area adjacent to the test pin area. There are no test pins in the avoidance area to avoid the first connecting unit from crushing the driving chip connecting unit in the test process, and then a good electrical contact can be formed between drive the chip and the driving chip connecting unit in the progress of the subsequent bonding. Thus, the problem of poor display of the display screen (for example, the problem of a bright line on the display screen) can be avoided. Furthermore, because only the structure of the signal transmission circuit board is improved, the design of the display screen does not need to be changed, and the cost can be saved under the condition that the poor display of the display screen can be effectively solved.

The above description is for the purpose of illustrating implementations of the present disclosure, but not to limit the scope of the present disclosure. Any equivalent structural or process transformation performed based on the drawings and the specification of the present disclosure, applied directly and indirectly in other related art, should be within the scope of the present disclosure.

What is claimed is:

1. A signal transmission circuit board, comprising a main body and a first connecting unit connected with the main body,
wherein the first connecting unit comprises a test pin area and an avoidance area adjacent to the test pin area,
wherein the avoidance area is free of test pins, and
wherein an outer contour of the avoidance area comprises at least two adjacent line segments connected to each other, and the two adjacent line segments are transiently connected by a straight line.

2. The signal transmission circuit board according to claim 1, wherein a thickness of the avoidance area is less than a thickness of the test pin area.

3. The signal transmission circuit board according to claim 2, wherein the avoidance area is a groove.

4. The signal transmission circuit board according to claim 3, wherein side walls of the groove are transited by curved surfaces, and the side walls of the groove and a bottom wall of groove are also transited by curved surfaces.

5. The signal transmission circuit board according to claim 1, wherein the avoidance area is a void area.

6. The signal transmission circuit board according to claim 5, wherein the test pin area comprises a first test pin area and a second test pin area, an end of the first test pin area away from the main body and an end of the second test pin area away from the main body are connected through a connector, and the void area is closed by the connector.

7. The signal transmission circuit board according to claim 5, wherein the test pin area comprises a first test pin area and a second test pin area, an end of the first test pin area away from the main body and an end of the second test pin area away from the main body are not connected, and a shape of the void area is unclosed.

8. The signal transmission circuit board according to claim 1, wherein the avoidance area is configured that in response to the first connecting unit being electrically connected with test pins of a display screen, the first connecting unit at least does not contact with a driving chip connecting unit of the display screen, or a force or pressure on the driving chip connecting unit is less than a threshold value in response to the first connecting unit contacting with the driving chip connecting unit.

9. The signal transmission circuit board according to claim 1, wherein the avoidance area is configured that in response to the first connecting unit being electrically connected with test pins of a display screen, the avoidance area is located on an overlapping area between the first connecting unit and a driving chip connecting unit, and the avoiding area is arranged on the first connecting unit.

10. The signal transmission circuit board according to claim 1, wherein the first connecting unit and the main body are integrated.

11. The signal transmission circuit board according to claim 1, wherein the first connecting unit comprises three test pin areas, and positions of the three test pin areas are not collinear and form a triangular position relationship.

12. A test system, comprising a test device and a signal transmission circuit board configured to connect the test device and a display screen,
wherein the signal transmission circuit board comprises a main body and a first connecting unit connected with the main body,
wherein the first connecting unit comprises a test pin area and an avoidance area adjacent to the test pin area,
wherein the avoidance area is free of test pins, and
wherein an outer contour of the avoidance area comprises at least two adjacent line segments connected to each other, and the two adjacent line segments are transiently connected by a straight line.

13. The test system according to claim 12, wherein a thickness of the avoidance area is less than a thickness of the test pin area.

14. The test system according to claim 12, wherein the avoidance area is a void area.

15. The test system according to claim 12, wherein the avoidance area is configured that in response to the first connecting unit being electrically connected with test pins of a display screen, the first connecting unit at least does not contact with a driving chip connecting unit of the display screen, or a force or pressure on the driving chip connecting unit is less than a threshold value in response to the first connecting unit contacting with the driving chip connecting unit.

16. The test system according to claim 12, wherein the display screen is a flexible display screen or a hard display screen, the signal transmission circuit board is a flexible circuit board, the main body comprises a second connecting unit, and the second connecting unit is configured to connect the test device.

17. The test system according to claim 12, wherein the avoidance area is configured that in response to the first connecting unit being electrically connected with test pins of a display screen, the avoidance area is located on an overlapping area between the first connecting unit and a driving chip connecting unit, and the avoiding area is arranged on the first connecting unit.

18. The test system according to claim 12, wherein the first connecting unit comprises three test pin areas, and positions of the three test pin areas are not collinear and form a triangular position relationship.

* * * * *